United States Patent
Maxim et al.

(10) Patent No.: US 10,630,248 B2
(45) Date of Patent: Apr. 21, 2020

(54) LOW-NOISE AMPLIFIER SYSTEM

(71) Applicant: Qorvo US, Inc., Greensboro, NC (US)

(72) Inventors: George Maxim, Saratoga, CA (US);
Marcus Granger-Jones, Scotts Valley, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/022,790

(22) Filed: Jun. 29, 2018

(65) Prior Publication Data

US 2020/0007093 A1 Jan. 2, 2020

(51) Int. Cl.
| | |
|---|---|
| *H03F 3/193* | (2006.01) |
| *H03F 1/56* | (2006.01) |
| *H03F 3/191* | (2006.01) |
| *H03F 1/22* | (2006.01) |
| *H03F 3/00* | (2006.01) |

(52) U.S. Cl.
CPC .............. *H03F 3/193* (2013.01); *H03F 3/005* (2013.01); *H03F 2200/294* (2013.01); *H03F 2200/372* (2013.01)

(58) Field of Classification Search
USPC .................. 330/277, 302, 311, 305
See application file for complete search history.

(56) References Cited

U.S. PATENT DOCUMENTS

| | | | |
|---|---|---|---|
| 8,629,725 B2 | 1/2014 | Scott et al. | |
| 10,332,960 B2 * | 6/2019 | Zhang | H01L 27/1203 |
| 2009/0091380 A1 * | 4/2009 | Min | H01L 27/0808 |
| | | | 327/586 |
| 2009/0115525 A1 * | 5/2009 | Yim | H03F 1/22 |
| | | | 330/277 |
| 2014/0266517 A1 * | 9/2014 | Werner | H01P 1/10 |
| | | | 333/262 |
| 2014/0361839 A1 * | 12/2014 | Scott | H03H 7/0115 |
| | | | 330/306 |

* cited by examiner

*Primary Examiner* — Hieu P Nguyen
(74) *Attorney, Agent, or Firm* — Withrow & Terranova, P.L.L.C.

(57) ABSTRACT

A low-noise amplifier system is disclosed. The low-noise amplifier system includes a low-noise amplifier having an input node and an output node in a receive path and a capacitance equalization network coupled to the output node. Compensation capacitance of the capacitance equalization network sums with non-linear capacitance of the low-noise amplifier such that a total capacitance at the output node varies by no more than ±5% over an output voltage range within voltage headroom limits of the low-noise amplifier for a given supply voltage of the low-noise amplifier. In at least some exemplary embodiments, the compensation capacitance of the capacitance equalization network is a function of output signal voltage at the output node.

18 Claims, 17 Drawing Sheets

LOW-NOISE AMPLIFIER SYSTEM

FIELD OF THE DISCLOSURE

The disclosure relates generally to low-noise amplifiers of radio frequency receivers and in particular to linearization of low supply voltage and headroom-constrained low-noise amplifier systems.

BACKGROUND

A low-noise amplifier used to amplify radio frequency (RF) signals such as those received at an antenna has non-linear output capacitance that degrades the linearity of the low-noise amplifier. Degraded linearity results in amplitude and phase distortion of the RF signals, which in turn may result in loss of information carried by the RF signals. What is needed is a low-noise amplifier system that mitigates the non-linearity of low-noise amplifiers due to non-linear output capacitance.

SUMMARY

A low-noise amplifier system is disclosed. The low-noise amplifier system includes a low-noise amplifier having an input node and an output node in a receive path and a capacitance equalization network coupled to the output node. Variable capacitance of the capacitance equalization network sums with non-linear capacitance of the low-noise amplifier such that a total capacitance at the output node varies by no more than ±5% over an output voltage range within voltage headroom limits of the low-noise amplifier for a given supply voltage of the low-noise amplifier. In at least some exemplary embodiments, the compensation capacitance of the capacitance equalization network is a function of output signal voltage at the output node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 2:
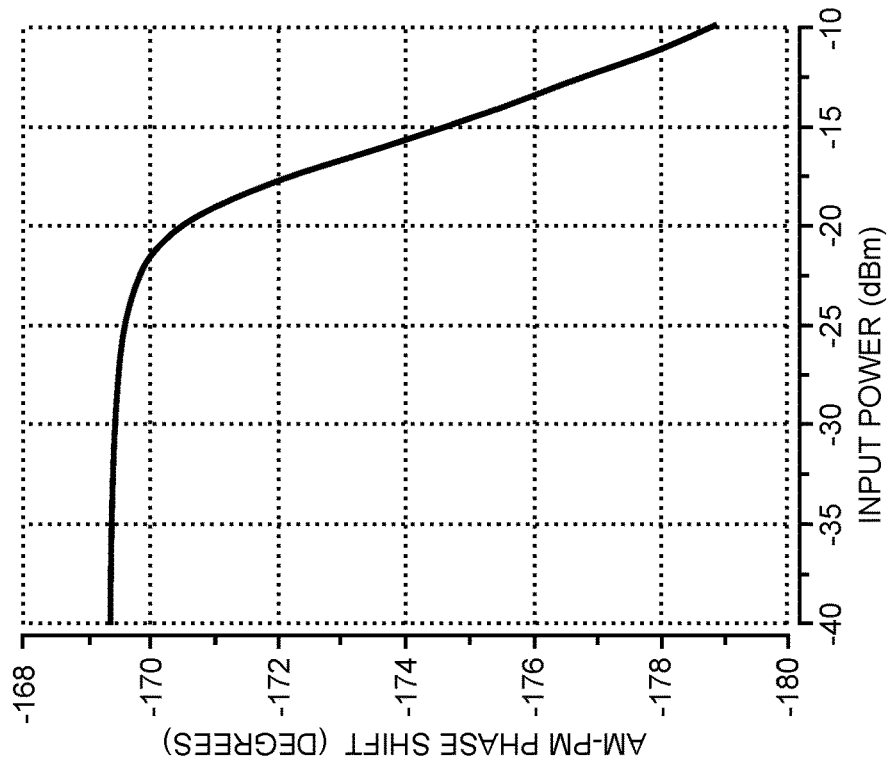
FIG. 2 is a graph of amplitude modulation-phase modulation (AM-PM) phase shift versus input power illustrating phase distortion due to the signal clipping effect of FIG. 1.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
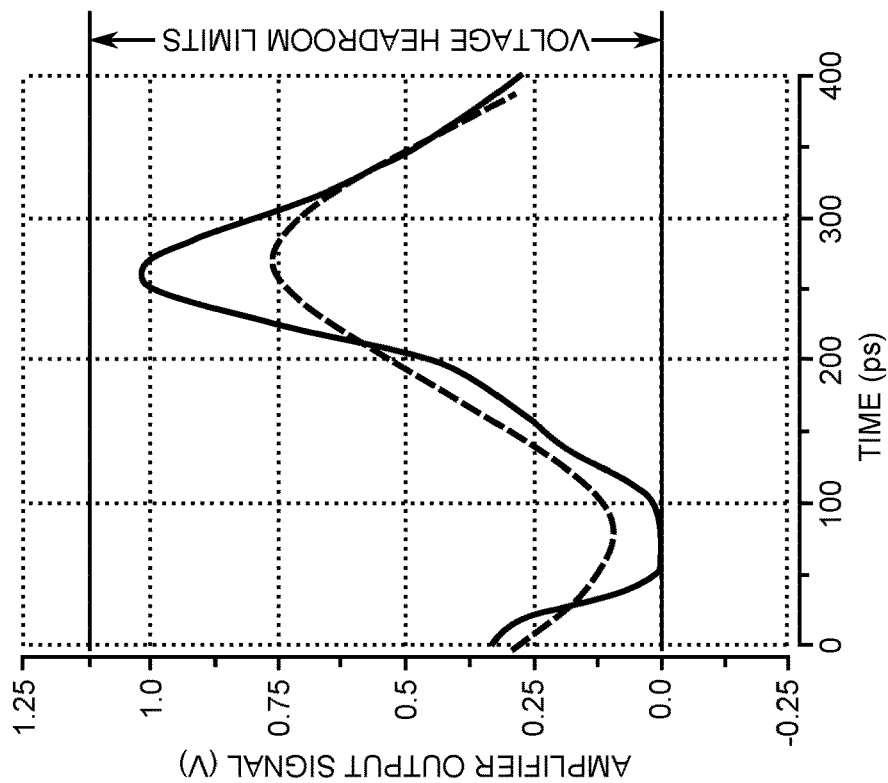
FIG. 1 is a graph of amplifier output signals that illustrates a signal clipping effect of a signal exceeding voltage headroom limits of a low-noise amplifier operating from a given supply voltage that is lower than traditional supply voltages.

FIG. 1 is a graph of amplifier output signals that illustrates a signal clipping effect of a signal exceeding voltage headroom limits of low-noise amplifiers operating from given supply voltages having lower magnitudes than traditional supply voltages. A first signal depicted in dashed line in FIG. 1 has not exceeded the voltage headroom limits and therefore has less distortion than a second signal depicted in solid line having a negative going amplitude peak that is clipped or crushed by exceeding a lower one of the headroom limits. The second signal is considered to have relatively severe distortion in comparison to the first signal. Both signals are amplified versions of a relatively purely sinusoidal signal having a period of around 400 picoseconds (ps) corresponding to a frequency of 2.5 gigahertz (GHz). Thus, even the first signal has some distortion due to non-linear capacitance of a low-noise amplifier providing the amplification to both signals.

FIG. 2 is a graph of amplitude modulation-phase modulation (AM-PM) phase shift versus input power illustrating phase distortion due to the non-linear capacitance of low-noise amplifiers that combined with relatively low supply voltage cause the signal clipping effect of FIG. 1. Notice that in the particular example of FIG. 2, phase distortion is no more than about a degree for input power levels less than −20 dBm. However, for input power levels greater than −20 dBm, phase distortion increases steadily to unacceptable levels for third generation (3G), 4G, and 5G wireless communication standards. Embodiments and methods of the present disclosure delay the clipping effect due to the headroom limits and provide increased linearity for signals within the headroom limits by compensating for the non-linear capacitance of low-noise amplifiers.

Figure 3:
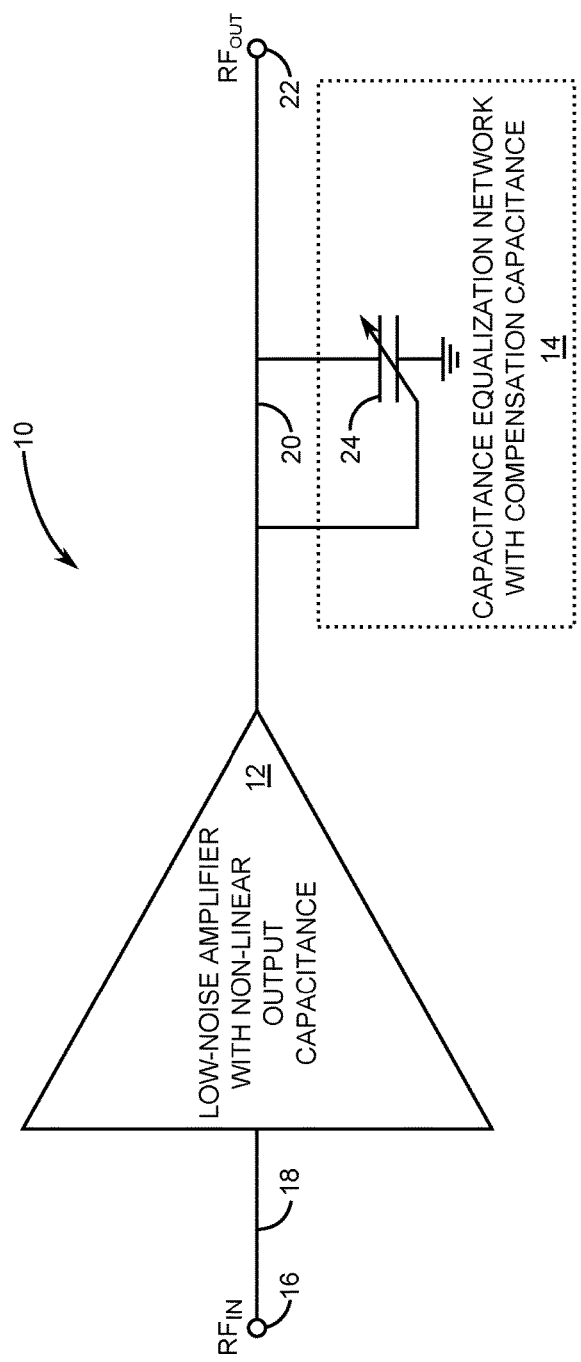
FIG. 3 is a general diagram depicting a low-noise amplifier system having a low-noise amplifier with non-linear output capacitance and a capacitance equalization network that compensates for non-linear output capacitance of the low-noise amplifier.

In this regard, FIG. 3 is a general diagram depicting a low-noise amplifier system 10 having a low-noise amplifier 12 with non-linear output capacitance and a capacitance equalization network 14 that compensates for non-linear output capacitance of the low-noise amplifier 12 in accordance with the present disclosure. The low-noise amplifier 12 has a receive path that includes a signal input terminal 16, $RF_{IN}$, coupled to an input node 18 and an output node 20 coupled to a signal output terminal 22, $RF_{OUT}$. The capacitance equalization network 14 is coupled to the output node 20.

Figure 4:
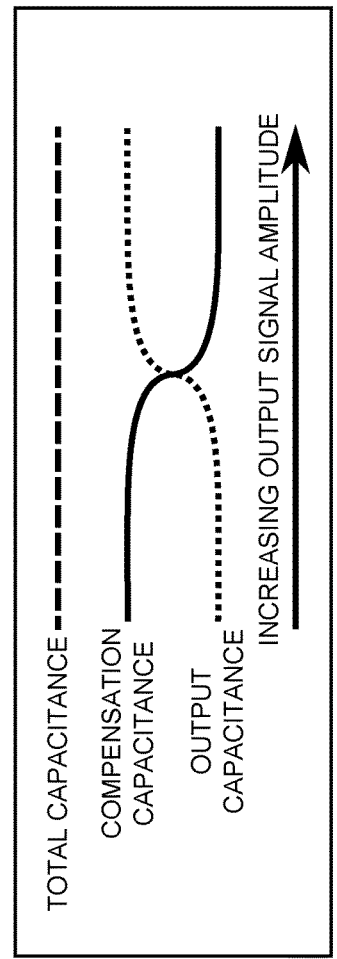
FIG. 4 is a chart depicting compensation capacitance of the capacitance equalization network summing with output capacitance to ideally provide a constant total capacitance.

As depicted in FIG. 4, compensation capacitance of the capacitance equalization network 14 sums with non-linear capacitance of the low-noise amplifier 12 such that a total capacitance at the output node 20 ideally does not vary. In practical exemplary embodiments, the total capacitance varies by no more than ±5% over an output voltage range within voltage headroom limits of the low-noise amplifier for a given supply voltage of the low-noise amplifier. In at least some exemplary embodiments, the capacitance equalization network 14 includes a varactor 24 that provides the compensation capacitance as a function of output signal voltage as depicted symbolically in FIG. 3 by coupling a symbolic control arrow of the varactor 24 to the output node 20. The low-noise amplifier 12 may be any of the complementary metal oxide semiconductor (CMOS), bipolar, or bipolar-CMOS (BiCMOS) types.

Figure 5:
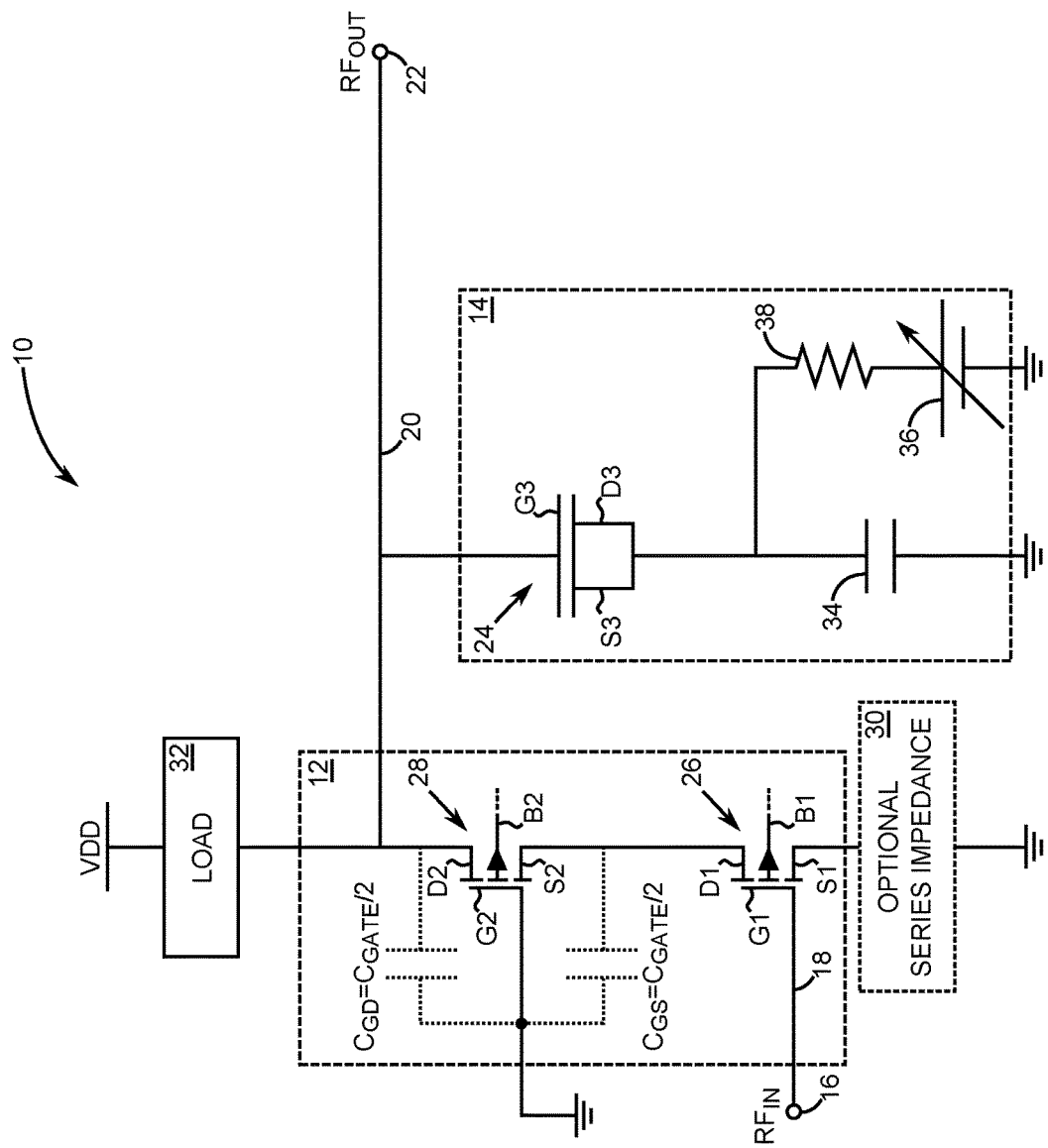
FIG. 5 is a schematic depicting an exemplary embodiment of the low-noise amplifier system of FIG. 3 realized with complementary metal oxide semiconductor (CMOS) technology.

FIG. 5 is a schematic depicting an exemplary embodiment of the low-noise amplifier system 10 realized with CMOS technology. In this exemplary embodiment, the low-noise amplifier 12 is a cascode amplifier with a main field-effect transistor (FET) 26 that provides gain to a signal applied to the signal input terminal 16, $RF_{IN}$. A first gate G1 of the main FET 26 is coupled to the signal input terminal 16, $RF_{IN}$. Optional series impedance 30 may be coupled between a first source S1 of the main FET 26 and a fixed voltage node such as ground to provide degeneration and impedance matching. A first bulk terminal B1 may be coupled to a bulk bias network (not shown) or to the first source S1. A first drain D1 of the main FET 26 is coupled to a second source S2 of a cascode FET 28.

The cascode FET 28 provides isolation between the signal input node 18 and a load 32 coupled to the output node 20. A second drain D2 of the cascode FET 28 is coupled to the output node 20, and a second gate G2 of the cascode FET is coupled to the fixed voltage node. The cascode FET 28 has parasitic non-linear capacitance that is represented symbolically in FIG. 5 in dotted line. A second bulk terminal B2 may be coupled to a bulk bias network (not shown) or to the second source S2. The parasitic non-linear capacitance at a large signal voltage level that approaches signal clipping is modelled by dividing gate capacitance $C_{GATE}$ between gate-to-drain capacitance $C_{GD}$ and gate-to-source capacitance $C_{GS}$. The parasitic non-linear capacitance is compensated by the capacitance equalization network 14.

In the exemplary embodiment of FIG. 5, the capacitance equalization network 14 includes the varactor 24 in the form of a FET with a third source S3 and a third drain D3 that are coupled together and a third gate G3 coupled to the output node 20. The third source S3 and third drain D3 are coupled to the fixed voltage node, which in this case is ground, by a coupling capacitor 34. A bias voltage source 36 for biasing the varactor 24 is coupled to the third source S3 and the third drain D3 through a bias resistor 38. In this exemplary embodiment, the bias voltage is adjustable such that a nominal compensation capacitance is established over process corners that include but are not limited to process, supply voltage, and temperature. A baseband processor or local processor on a die on which the low-noise amplifier resides is usable to adjust the bias voltage source 36 to provide various bias voltage levels in response to changing conditions such as voltage, temperature, and frequency of operation. Departures from the nominal compensation capacitance are a function of signal voltage level at the output node 20.

In this exemplary embodiment, the low-noise amplifier 12 is supplied with power by a supply voltage VDD. In some embodiments, the supply voltage is from 1.6 V to 2 V, which includes a standard battery voltage such as 1.8 V. In other embodiments, the supply voltage VDD is from 1 V to 1.6 V, which includes a standard battery voltage of 1.2 V. In yet other embodiments, the supply voltage VDD is from 0.5 V to 1 V.

Figure 6:
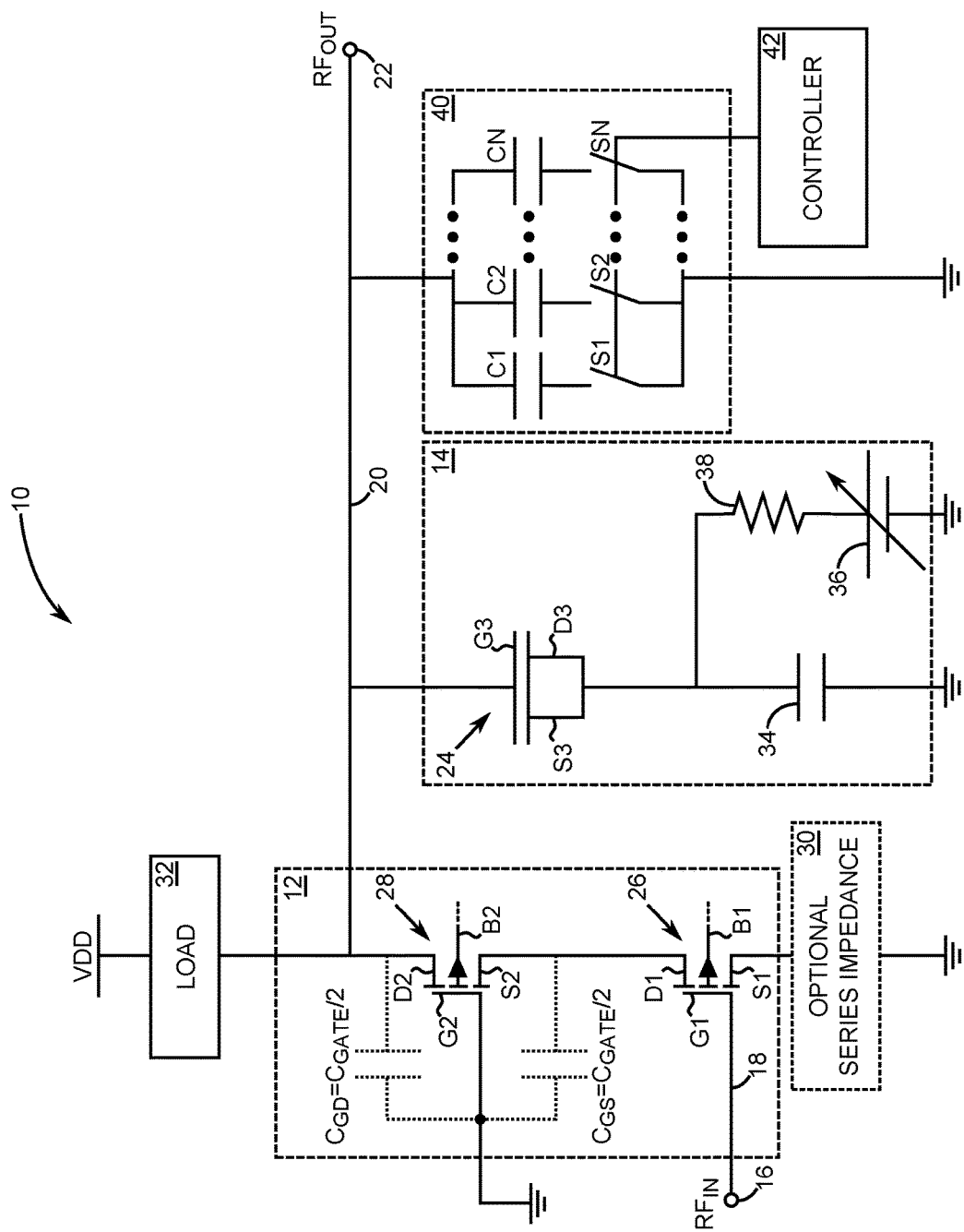
FIG. 6 is a schematic depicting an exemplary embodiment of the low-noise amplifier system of FIG. 3 realized with CMOS technology and including a programmable capacitor array to adjust a nominal compensation capacitance for various communication bands.

FIG. 6 is a schematic depicting an exemplary embodiment of the low-noise amplifier system 10 of FIG. 3 realized with CMOS technology and including a programmable capacitor array 40 to adjust a nominal compensation capacitance for various communication bands. For some applications that operate over multiple communication bands it is desirable to adjust the nominal capacitance up or down depending upon a given communications band of operation. The programmable capacitor array 40 has a bank of fixed value capacitors C1 and C2-CN that are individually selectable by way of electronic switches S1 and S2-SN to couple desired ones of the capacitors in parallel with the varactor 24. A controller 42 that is typically a baseband controller with a digital processor and memory sends control signals to the turn the switches S1 and S2-SN on and off, which in turn couple and decouple individual ones of the fixed value capacitors C1 and C2-CN from a node such as ground in this case. In an alternative, the controller 42 may be a local digital processor with registers integrated onto a die on which the low-noise amplifier resides.

As shown in FIG. 6, the programmable capacitor array 40 has positive plates of the fixed value capacitors C1 and C2-CN coupled to the output node 20 and throws of the switches S1 and S2-SN coupled to the fixed voltage node, which in this case is ground. However, it is to be understood that the throws of the switches S1 and S2-SN may be coupled to the output node 20 with negative plates of the fixed value capacitors C1 and C2-CN coupled to the fixed voltage node.

Figure 7:
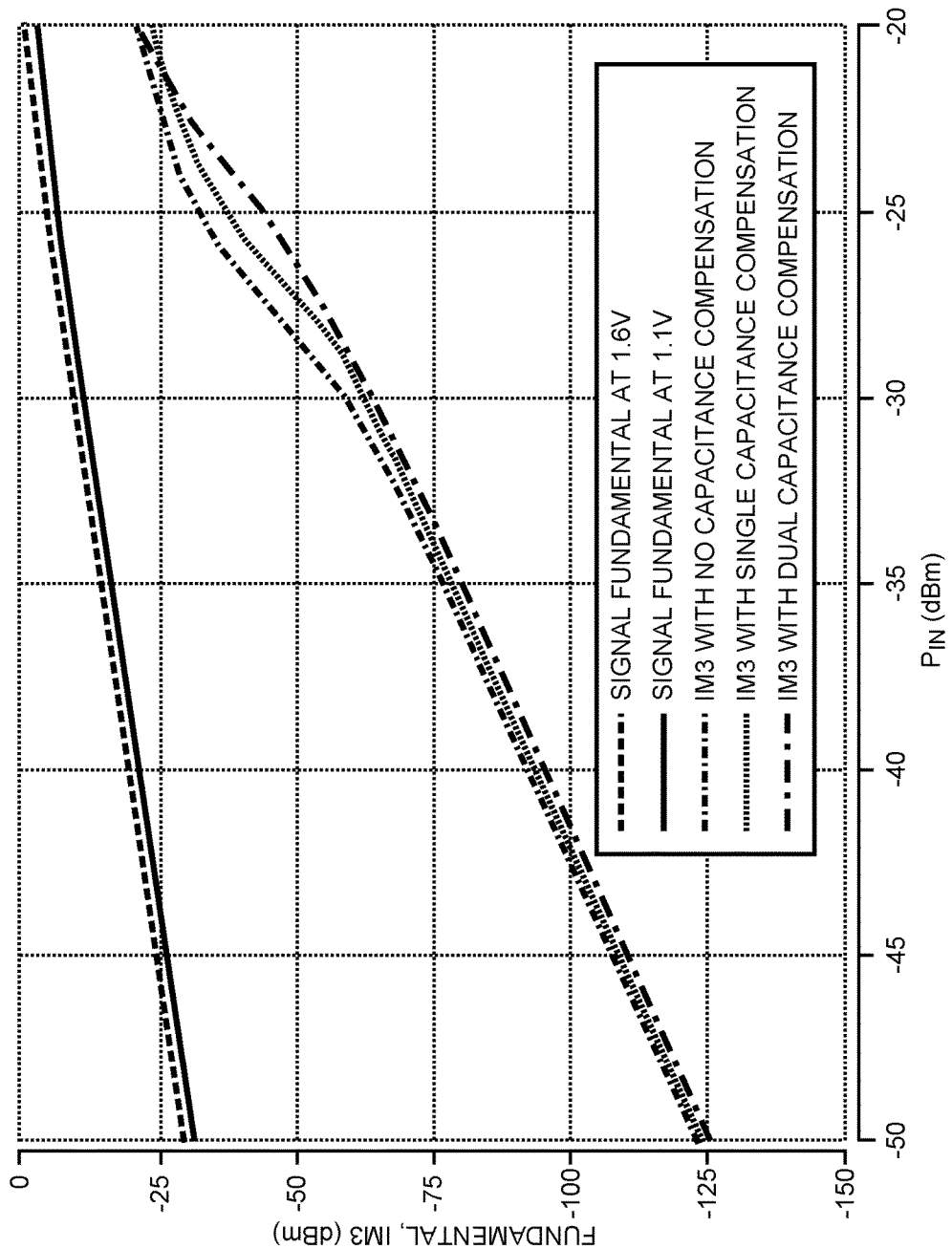
FIG. 7 is a diagram of fundamental output power and third-order intermodulation distortion versus input power for conditions of no capacitance compensation, single capacitance compensation, and dual capacitance compensation.

FIG. 7 is a diagram of fundamental output power and third-order intermodulation distortion versus input power for conditions of no capacitance compensation, single capacitance compensation, and dual capacitance compensation.

Figure 8:
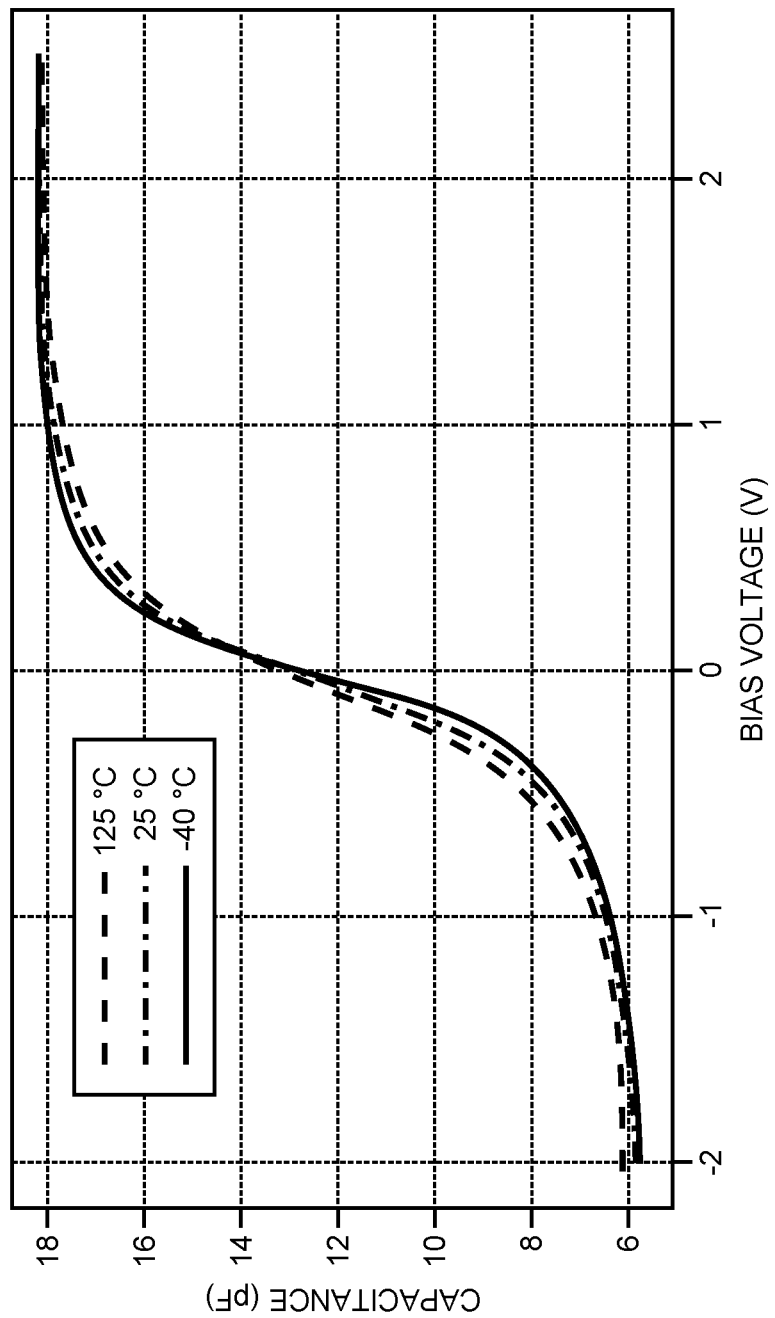
FIG. 8 is a graph of a transfer function of varactor capacitance versus bias voltage.

FIG. 8 is a graph of a transfer function of varactor capacitance versus bias voltage of the bias voltage source 36. The graph illustrates temperature stability of the capacitance equalization network 14. Also, the graph of the transfer function depicts an over 200% change in capacitance for the varactor 24 over a bias voltage range from −1 V to 1 V. In this exemplary case, the varactor 24 is an n-type FET (NFET)-type accumulation metal oxide semiconductor varactor in an N-well. However, a p-type FET (PFET)-type accumulation metal oxide semiconductor varactor is also realizable. In other embodiments, the varactor 24 is an inversion mode-type varactor. In yet other embodiments, the varactor 24 is a positive-negative (PN) junction-type varactor. In still other embodiments, the varactor 24 is a positive-intrinsic-negative (PIN)-type varactor.

Figure 9:
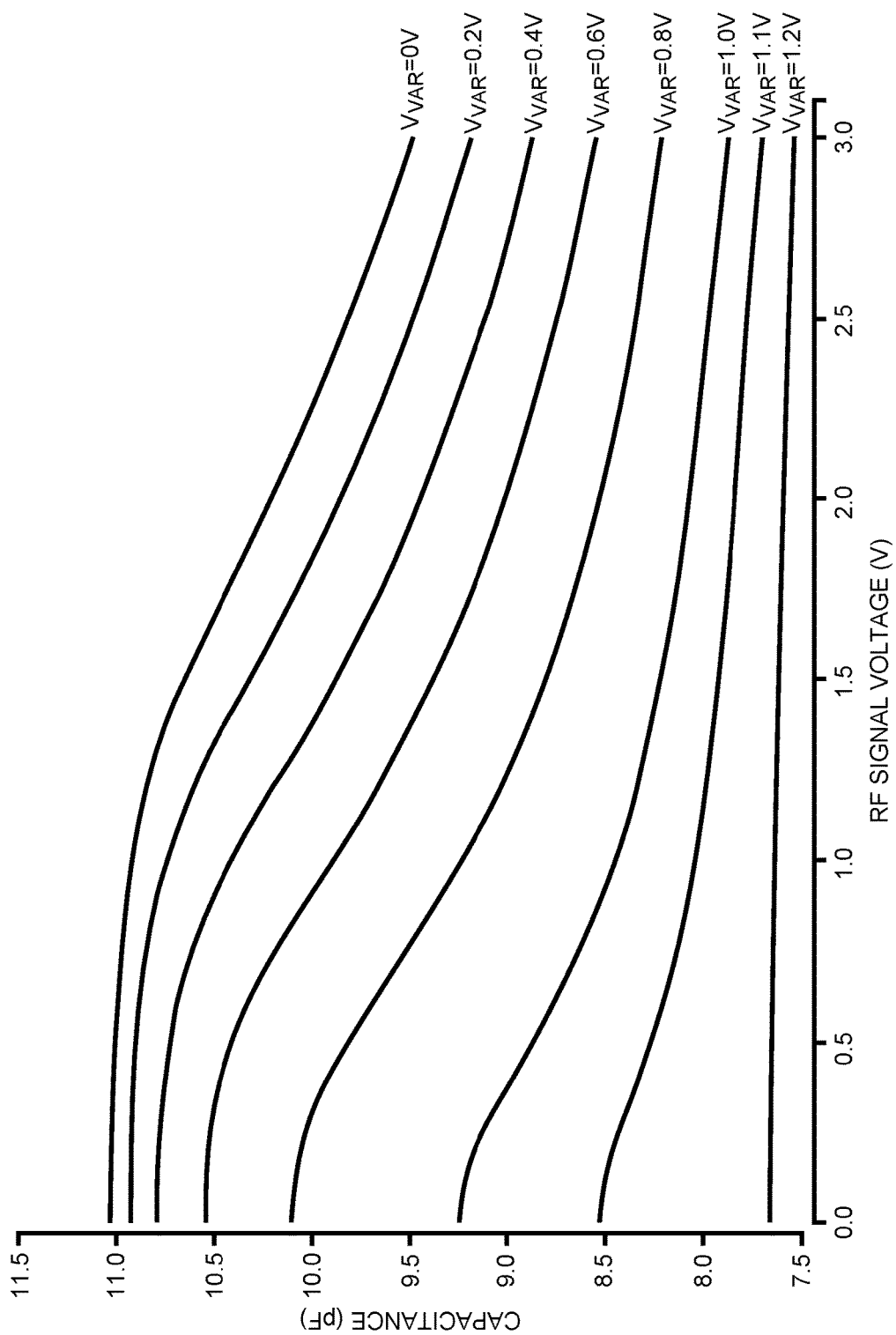
FIG. 9 is a graph of varactor capacitance for a range of radio frequency (RF) signal voltages at various bias voltage levels.

FIG. 9 is a graph of varactor capacitance for a range of RF signal voltages at various bias voltage $V_{VAR}$ levels. In the example of FIG. 9, the RF signal voltage on output node 20 (FIGS. 3, 5, and 6) ranges from 0 V to 3 V, while the bias voltage $V_{VAR}$ provided by the bias voltage source 36 ranges from 0 V to 1.1 V.

Figure 10:
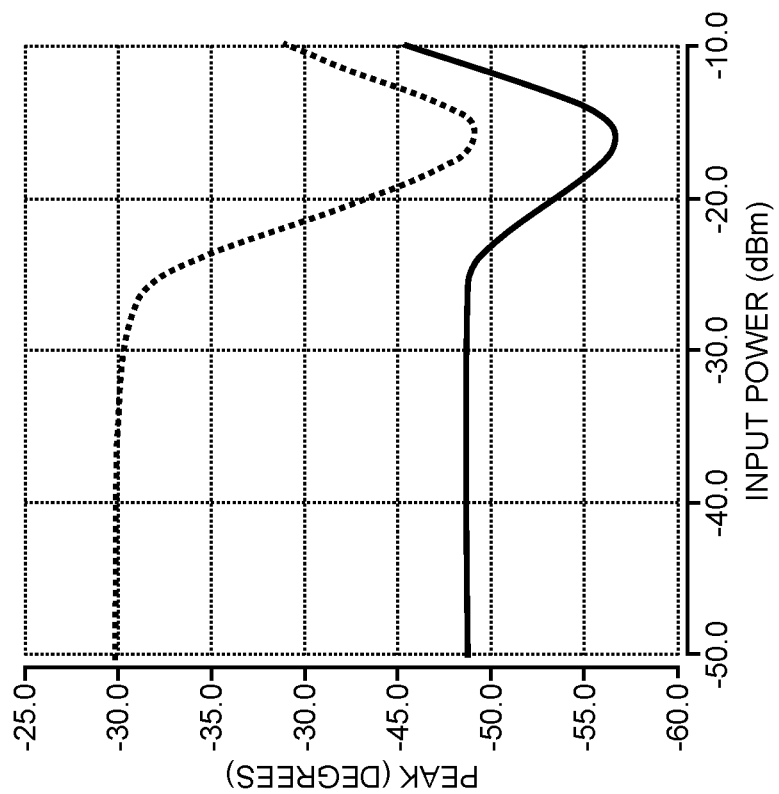
FIG. 10 is an exemplary graph of AM-PM phase distortion for peak amplitude of the RF signal voltage at an output node in degrees versus input power.

FIG. 10 is an exemplary graph of AM-PM phase distortion for peak amplitude of the RF signal voltage at the output node 20 in degrees versus input power. A dashed plot line represents AM-PM phase distortion without capacitance compensation. A solid plot line depicts AM-PM phase distortion with capacitance compensation provided by the capacitance equalization network 14 (FIGS. 3, 5, and 6).

Figure 11:
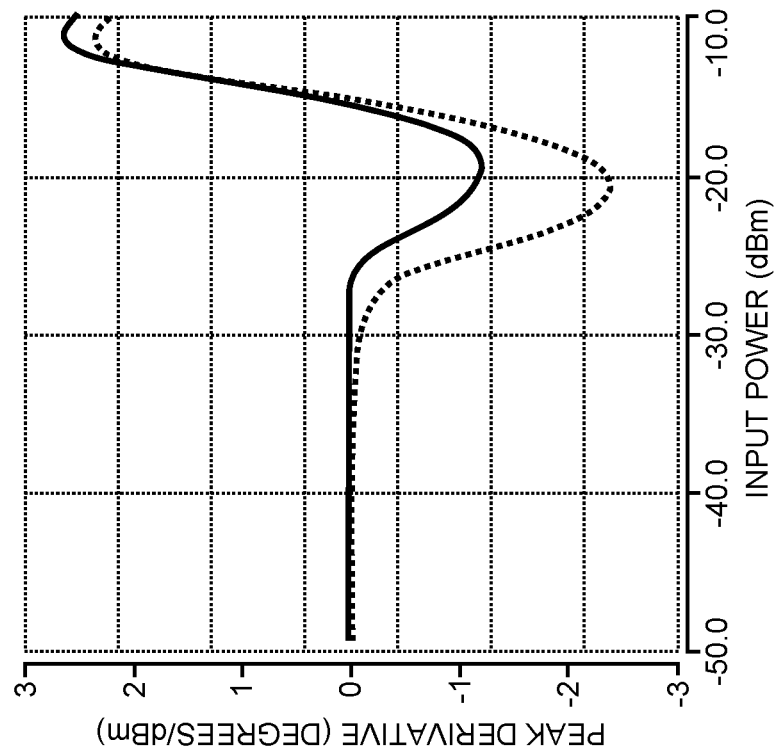
FIG. 11 is an exemplary graph of a derivative AM-PM phase distortion for peak amplitude of the RF signal voltage at an output node in degrees versus input power.

FIG. 11 is an exemplary graph of a derivative AM-PM phase distortion for peak amplitude of the RF signal voltage at an output node in degrees versus input power. A dashed plot line represents the derivative of AM-PM phase distortion without capacitance compensation. A solid plot line depicts the derivative of AM-PM phase distortion with capacitance compensation provided by the capacitance equalization network 14 (FIGS. 3, 5, and 6). As depicted in FIG. 11 there is a point where the phase derivative goes above 0.5 degrees per decibel-milliwatt (dBm) and is translated by about 2.5 dBm, which corresponds to an similar improvement in output third-order intercept.

Figure 12:
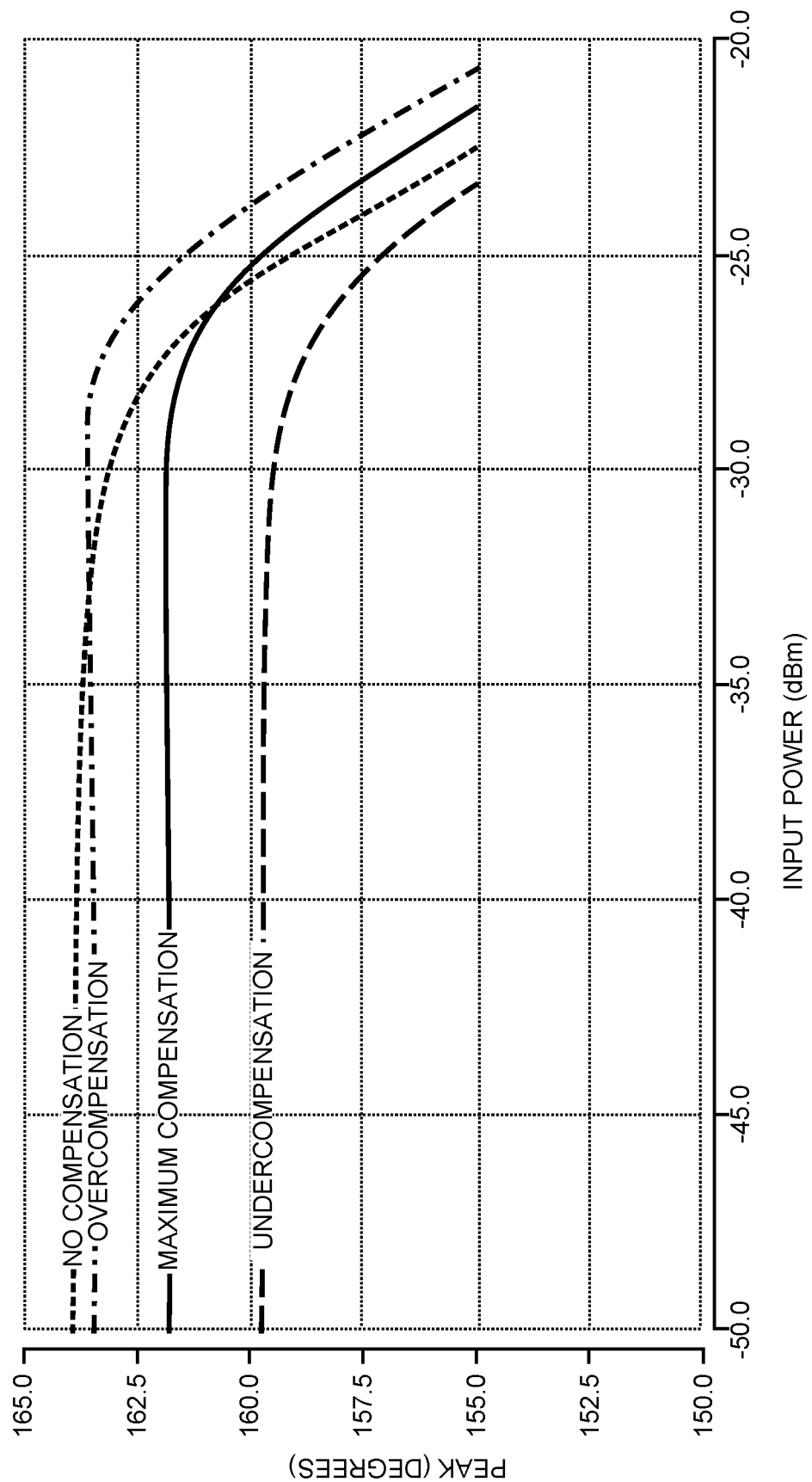
FIG. 12 is an exemplary graph of AM-PM phase distortion for peak amplitude of the RF signal voltage at the output node in degrees versus input power for conditions of various capacitance compensations provided by the capacitance equalization block.

FIG. 12 is an exemplary graph of AM-PM phase distortion for peak amplitude of the RF signal voltage at the output node 20 in degrees versus input power for conditions of no compensation, overcompensation, maximum compensation, and undercompensation of capacitance provided by the capacitance equalization network 14. As shown in FIG. 12, the maximum compensation line indicates the lowest third-order intermodulation distortion for a maximum range of input power.

Figure 13:
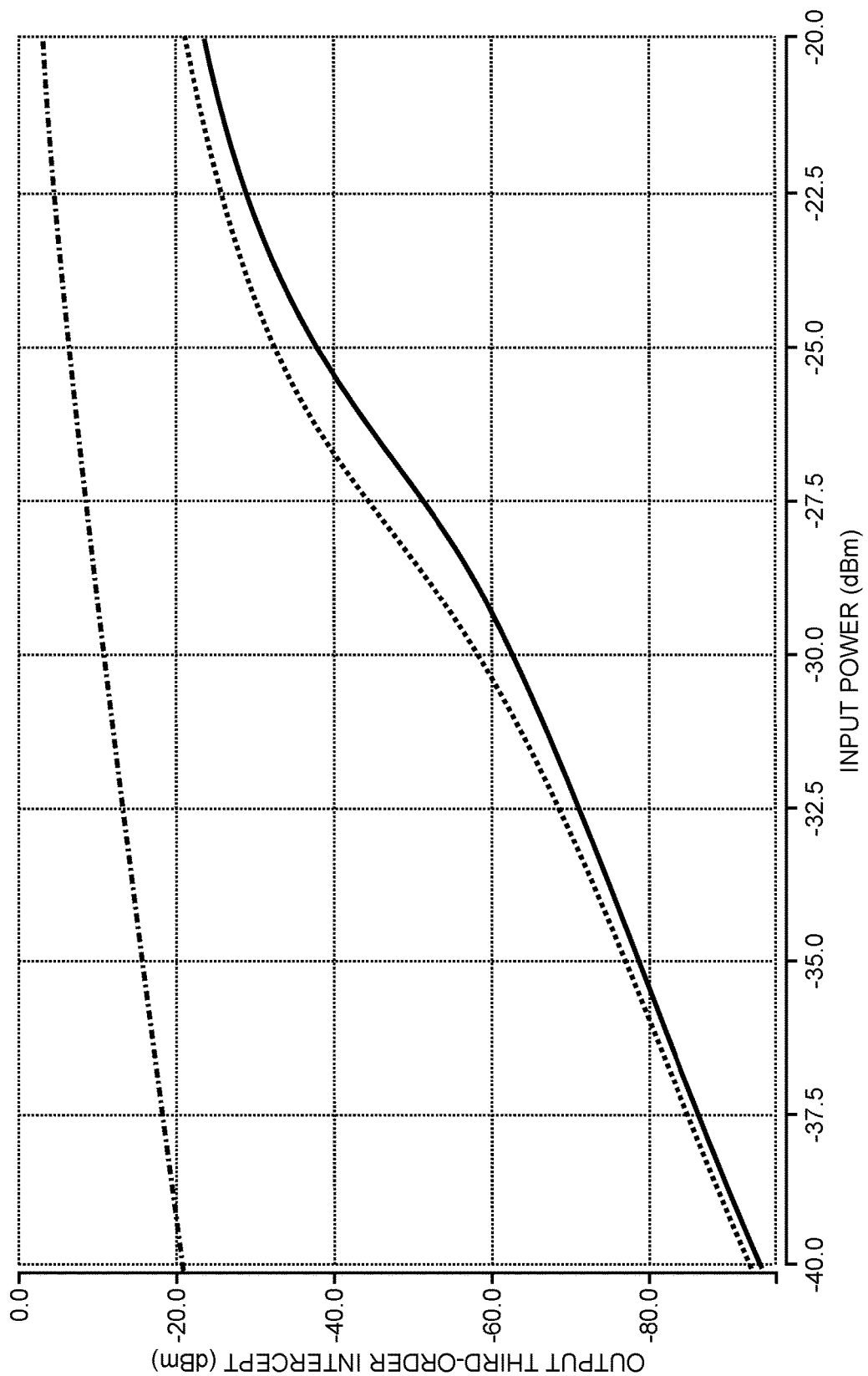
FIG. 13 is a graph of output third-order intercept versus input power comparing no capacitance compensation with maximum capacitance compensation.

FIG. 13 is a graph of output third-order intercept versus input power comparing no capacitance compensation with maximum capacitance compensation. The dotted and dashed line represents output power of the fundamental of an output signal at the output node 20 versus input power. The short-dash line represents output third-order intercept versus input power with no capacitance compensation. The solid line represents output third-order intercept versus input power with maximum capacitance compensation provided by the capacitance equalization network 14.

Figure 14:
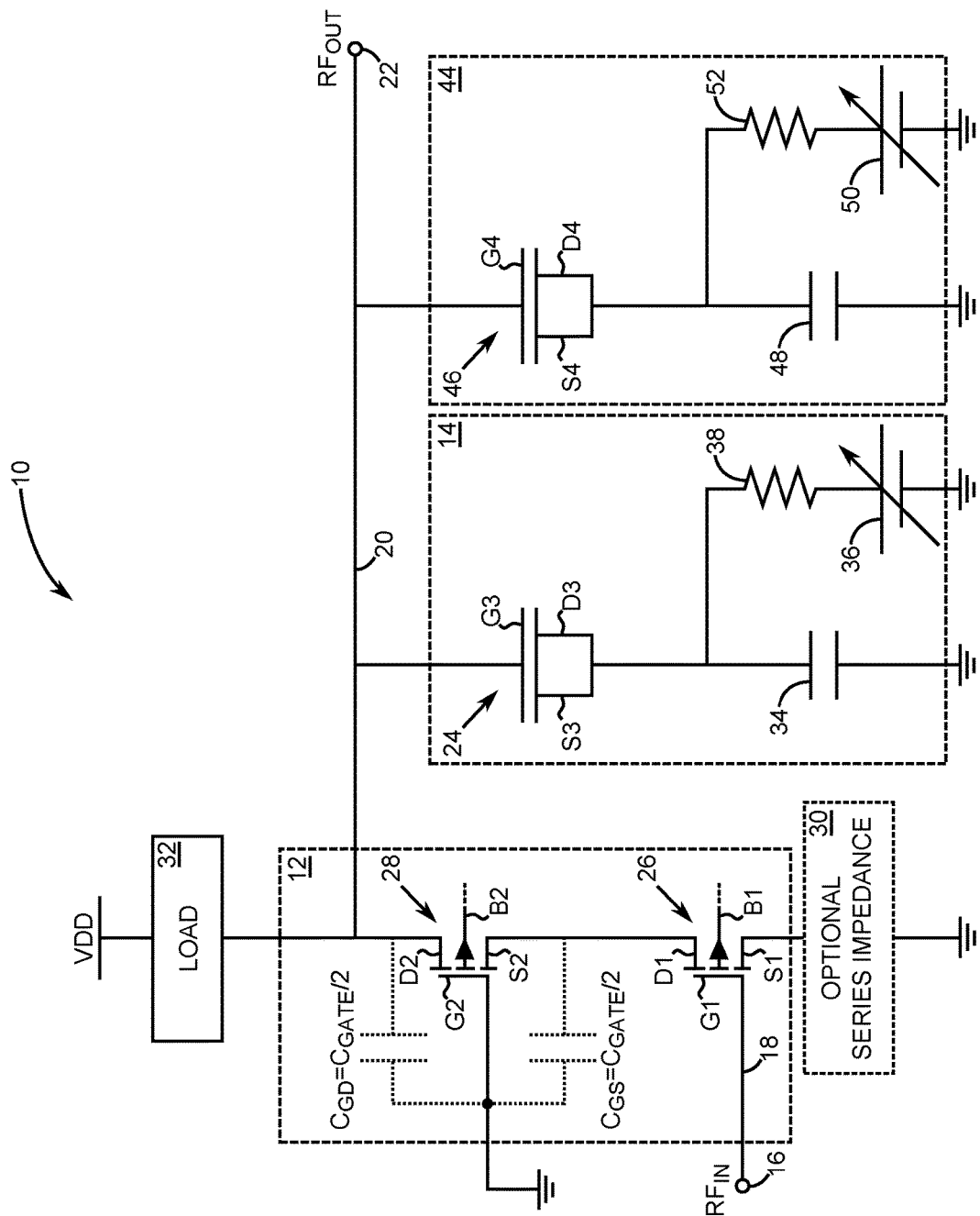
FIG. 14 is a schematic depicting an exemplary embodiment of the low-noise amplifier system of FIG. 3 having an additional capacitance equalization block.

FIG. 14 is a schematic depicting an exemplary embodiment of the low-noise amplifier system 10 of FIG. 3 having an additional capacitance equalization network 44 that includes a varactor 46 in the form of a FET with a fourth source S4 and a fourth drain D4 that are coupled together and a fourth gate G4 coupled to the output node 20. The fourth source S4 and the fourth drain D4 are coupled to the fixed voltage node, which in this case is ground, by a coupling capacitor 48. An additional bias voltage source 50 for biasing the varactor 46 is coupled to the fourth source S4 and the fourth drain D4 through a bias resistor 52. In this exemplary embodiment, the bias voltage is adjustable such that a nominal compensation capacitance is established over process corners that include but are not limited to process, supply voltage, and temperature. Departures from the nominal compensation capacitance are a function of signal voltage level at the output node 20. The exemplary embodiment of FIG. 14 employs the additional capacitance equalization network 44 to realize a piecewise linearization of the low-noise amplifier 12. Further, additional capacitance equalization blocks are employable to realize additional capacitance compensation to provide even more finely adjusted linearization of the low-noise amplifier 12.

Figure 15:
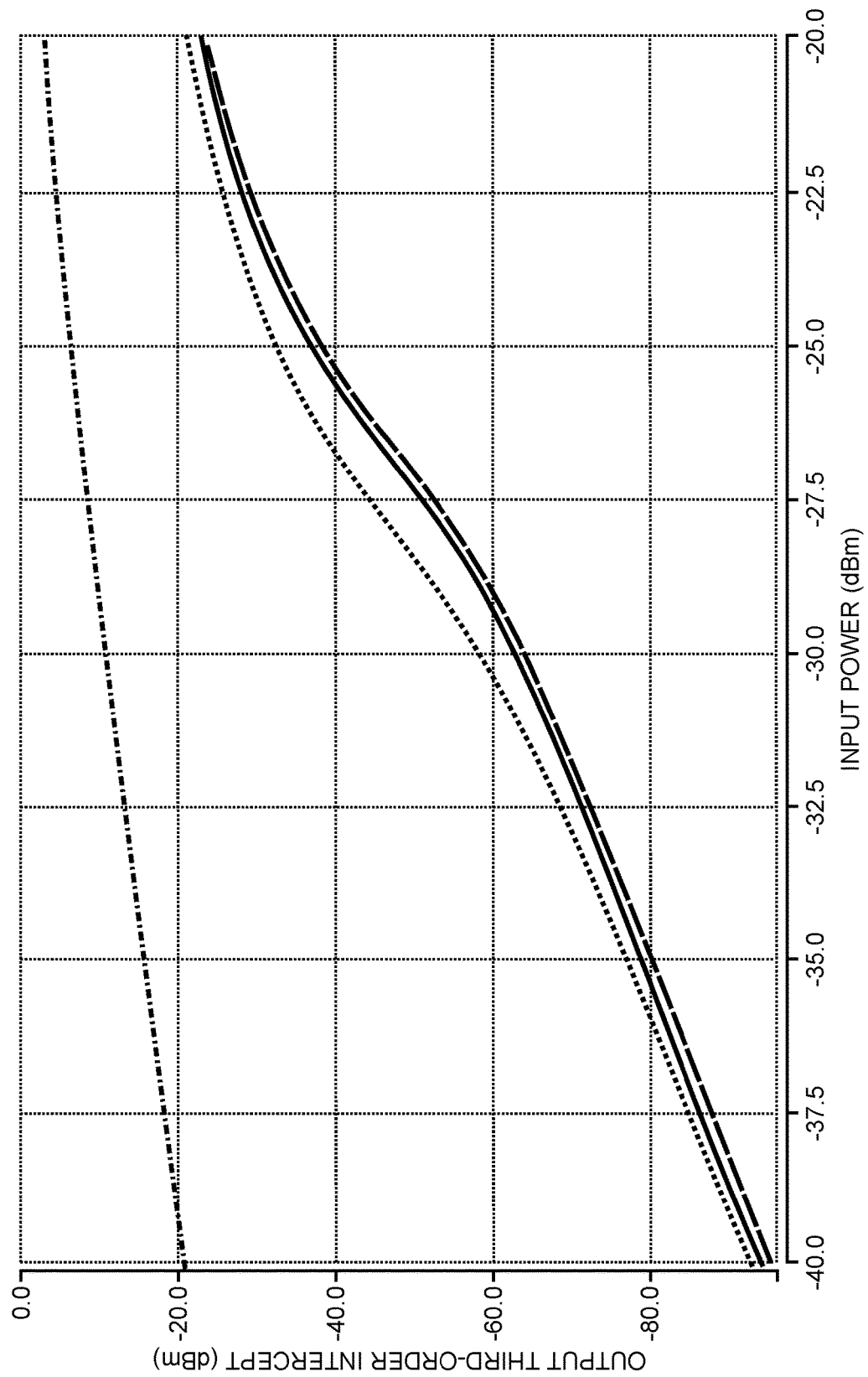
FIG. 15 is a graph of output third-order intercept versus input power comparing no capacitance compensation with single capacitance compensation and dual capacitance compensation that provide piecewise linearization of the low-noise amplifier.

FIG. 15 is a graph of output third-order intercept versus input power comparing no capacitance compensation with single capacitance compensation and dual capacitance compensation that provide piecewise linearization of the low-noise amplifier 12. The dotted and dashed line represents output power of the fundamental of an output signal at the output node 20 versus input power. The short-dash line represents output third-order intercept versus input power with no capacitance compensation. The solid line represents output third-order intercept versus input power with single capacitance compensation provided by the capacitance equalization network 14. The long-dash line represents dual capacitance compensation provided by both the capacitance equalization network 14 and the additional capacitance equalization network 44.

Figure 16:
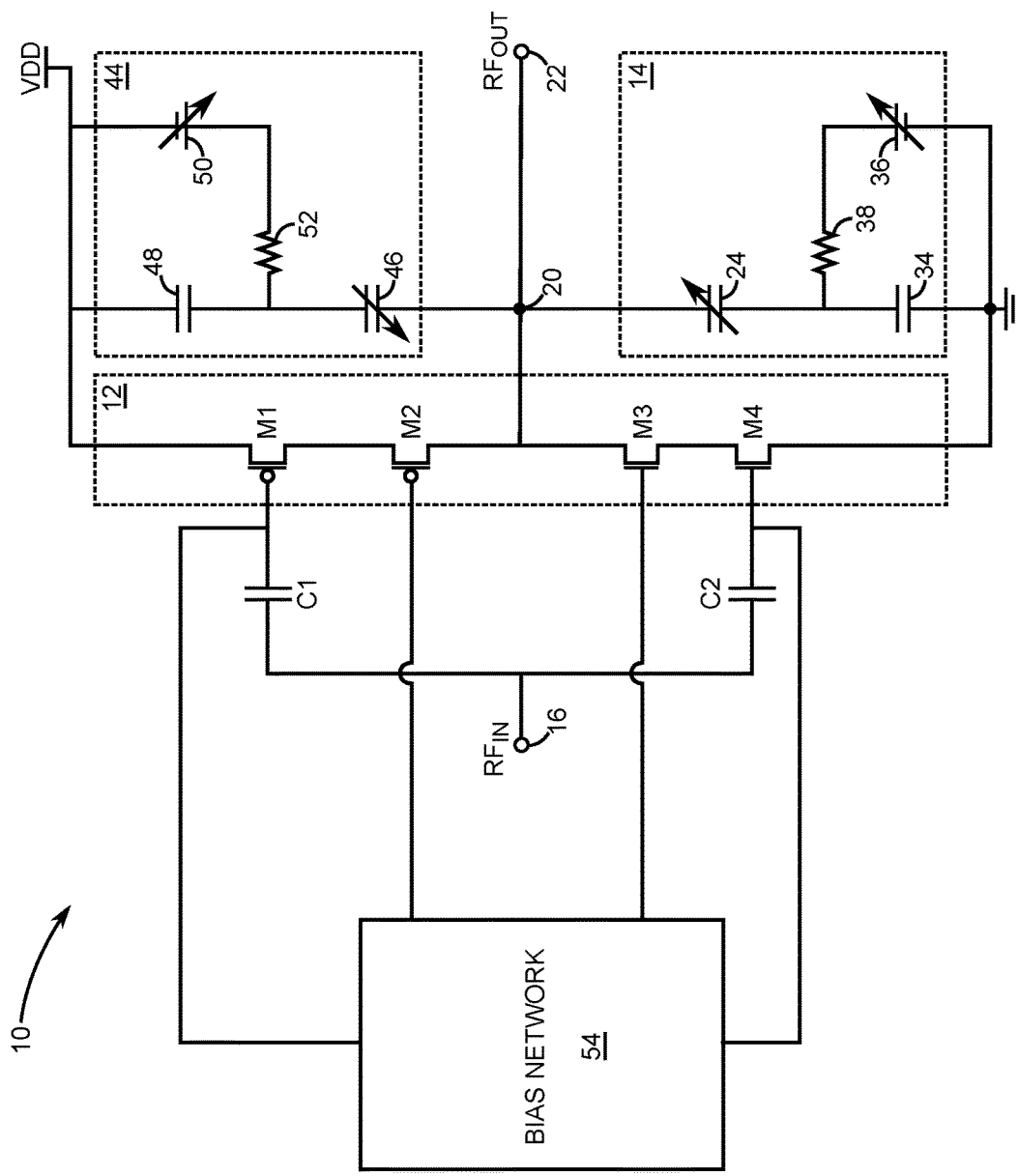
FIG. 16 is a schematic of an exemplary embodiment of the low-noise amplifier system having the capacitance equalization block formed in an N-well and the additional capacitance equalization block formed in a P-well.

FIG. 16 is a schematic of an exemplary embodiment of the low-noise amplifier system 10 having the capacitance equalization network 14 formed in an N-well and the additional capacitance equalization network 44 formed in a P-well. In this exemplary embodiment, the low-noise amplifier 12 includes a pair of series-coupled PFETs M1 and M2 coupled in series with a pair of series-coupled NFETS M3 and M4. A bias network 54 provides bias voltages to the low-noise amplifier 12. Gates of the PFET M1 and the NFET M4 are coupled to the signal input terminal 16, RF$_{IN}$, through a first signal coupling capacitor C1 and a second signal coupling capacitor C2, respectively. In this exemplary embodiment, the capacitance equalization network 14 is coupled in parallel with the NFETs M3 and M4, while the additional capacitance equalization network 44 is coupled in parallel with the PFETs M1 and M2. Moreover, in this exemplary embodiment the capacitance equalization network 14 is formed in an N-well along with the NFETs M3 and M4, while the additional capacitance equalization network 44 is formed in a P-well along with the PFETs M1 and M2. However, in other embodiments, the additional capacitance equalization network 44 may be formed in an N-well separate from the PFETs M1 and M2.

Figure 17:
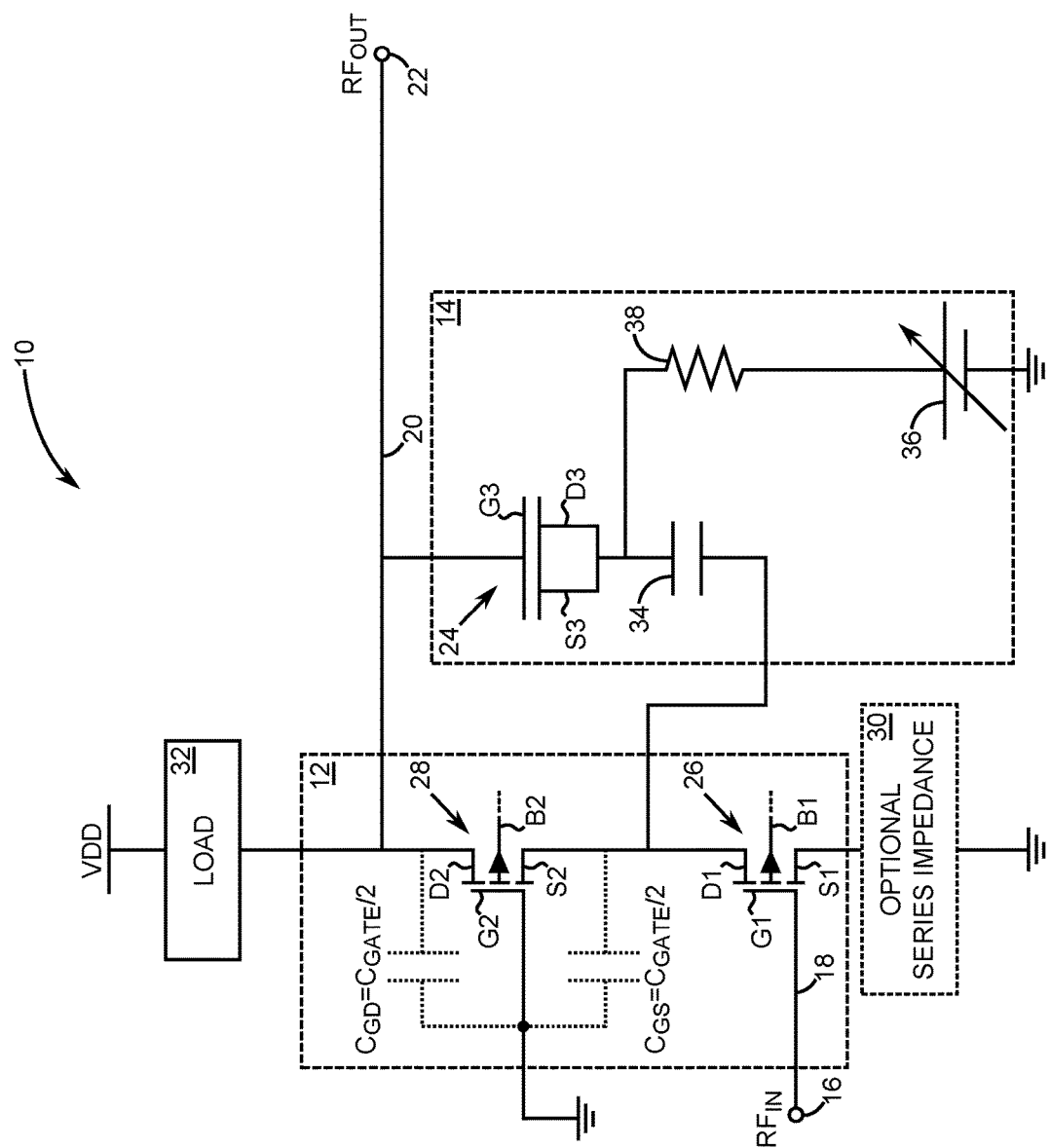
FIG. 17 is a schematic of an exemplary embodiment of the low-noise amplifier system having the capacitance equalization block coupled in parallel with a cascode field-effect transistor.

FIG. 17 is a schematic of an exemplary embodiment of the low-noise amplifier system 10 having the capacitance equalization network 14 coupled in parallel with cascode FET 28. In this particular case, the varactor 24 more directly compensates for the non-linear capacitance of the cascode FET 28.

Figure 18:
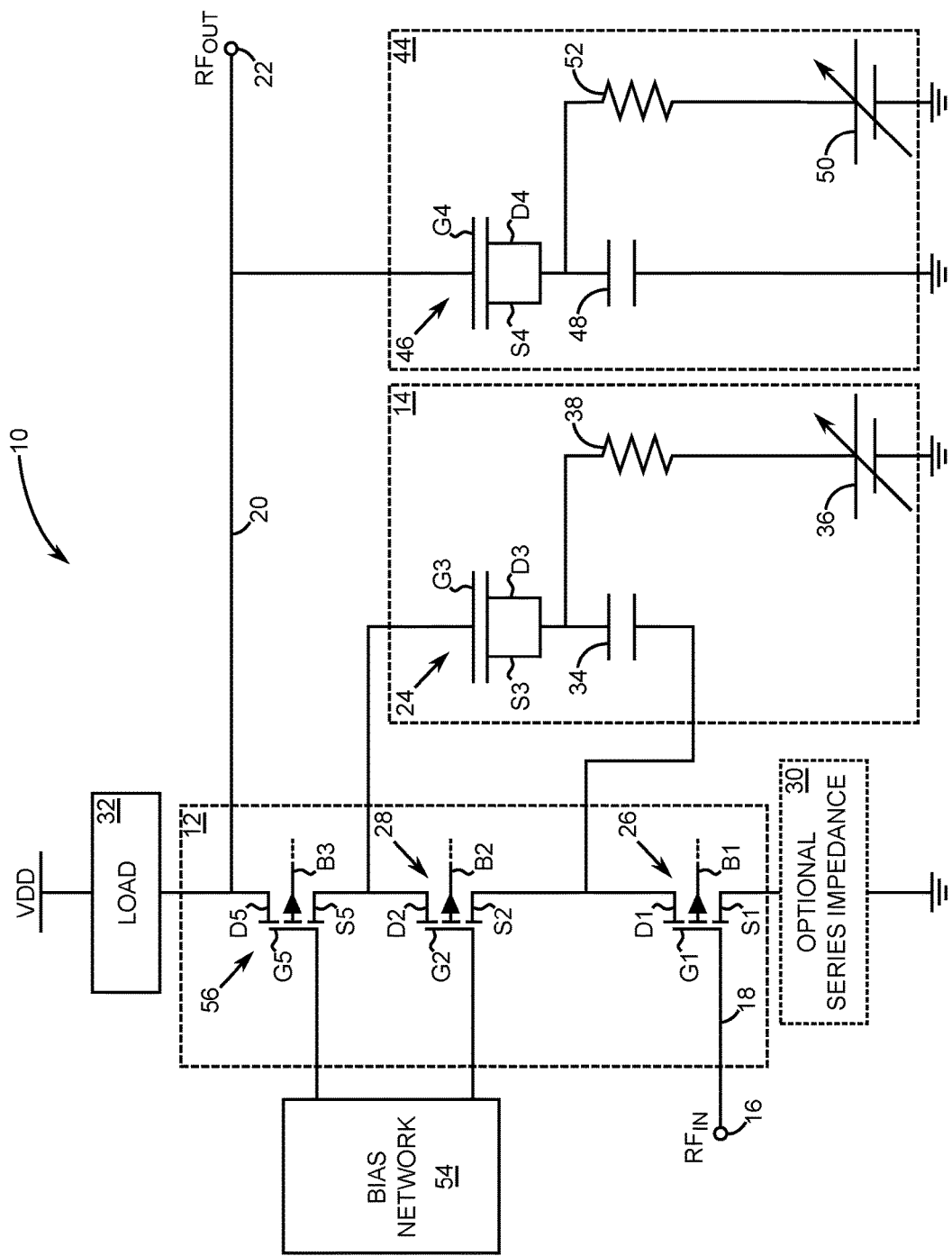
FIG. 18 is a schematic of an exemplary embodiment of the low-noise amplifier system having the capacitance equalization block coupled in parallel with the cascode field-effect transistor and an additional capacitance equalization block coupled in parallel with the low-noise amplifier.

FIG. 18 is a schematic of an exemplary embodiment of the low-noise amplifier system 10 having the capacitance equalization network 14 coupled in parallel with the cascode FET 28 and the additional capacitance equalization network 44 coupled to the output node 20 into parallel with the low-noise amplifier 12. In this particular embodiment, a drive FET 56 has a fifth drain D5 coupled to the output node 20, a fifth gate G5 coupled to the bias network 54, and a fifth source S5 coupled to the second drain D2. A third bulk terminal B3 may be coupled to a bulk bias network (not shown) or to the fifth source S5.

Figure 19:
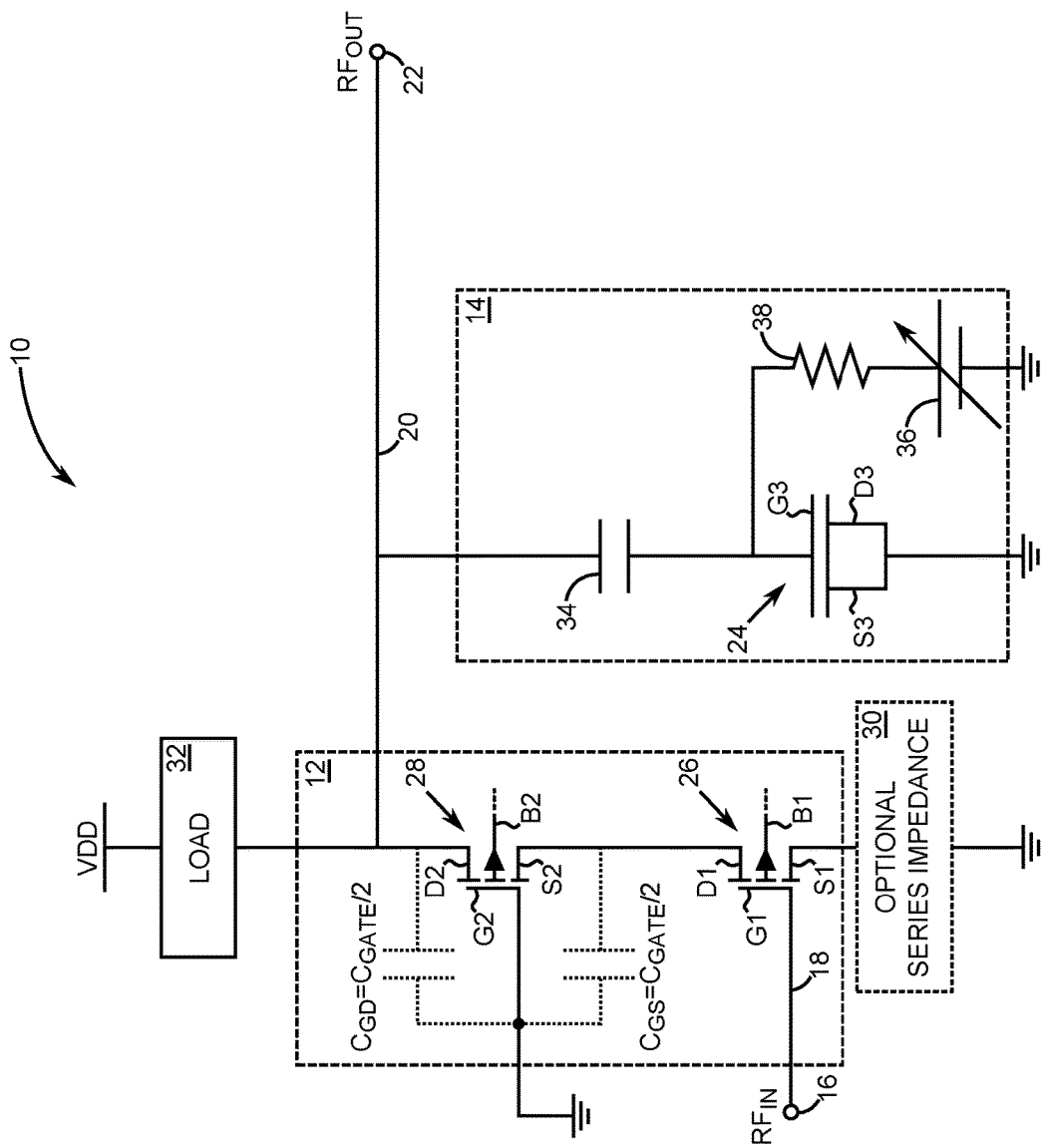
FIG. 19 is a schematic of an exemplary embodiment of the low-noise amplifier system in which the varactor of the capacitance equalization block is hard-coupled to the fixed voltage node, such as ground.

FIG. 19 is a schematic of an exemplary embodiment of the low-noise amplifier system 10 in which the varactor 24 of the capacitance equalization network 14 is hard-coupled to the fixed voltage node, such as ground. In this particular case, a positive plate of the coupling capacitor 34 is coupled to the output node 20, and the third source S3 and the third drain D3 of the varactor 24 are coupled directly to the fixed voltage node, which in this case is ground.

Figure 20:
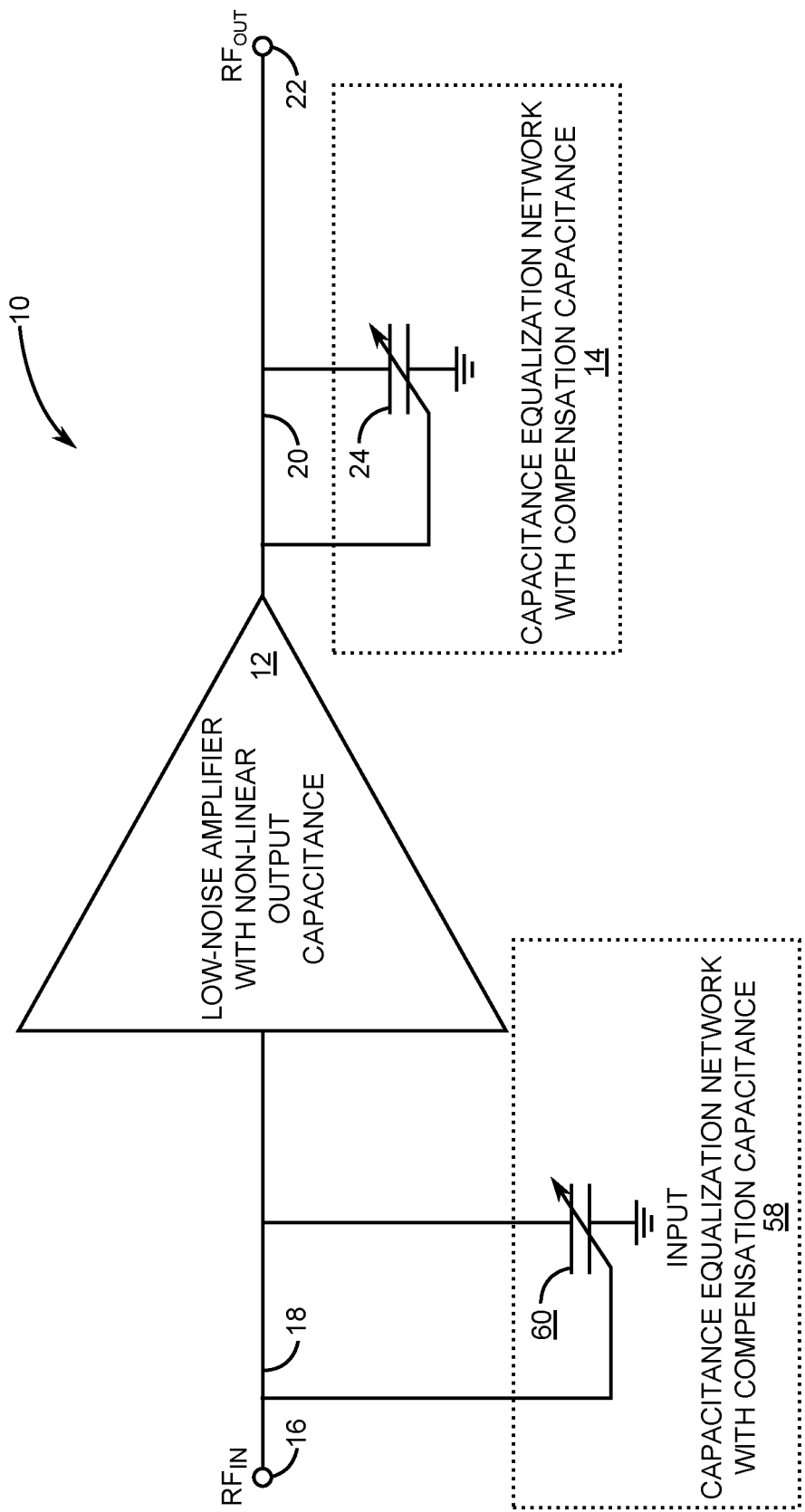
FIG. 20 is a schematic of a modified version of the low-noise amplifier of FIG. 3 that further includes an input capacitance equalization network for compensating for non-linear input capacitance of the low-noise amplifier.

FIG. 20 is a schematic of a modified version of the low-noise amplifier 10 of FIG. 3 that further includes an input capacitance equalization network 58 for compensating for non-linear input capacitance of the low-noise amplifier 12. The input capacitance equalization network 58 includes an input varactor 60 that is coupled between the signal input node 18 and the fixed voltage node, which in this exemplary case is ground. The input varactor 60 is inherently adjusted by an average of an input signal applied to the signal input terminal 16, RF$_{IN}$.

Those skilled in the art will recognize improvements and modifications to the preferred embodiments of the present disclosure. All such improvements and modifications are considered within the scope of the concepts disclosed herein and the claims that follow.

What is claimed is:

1. A low-noise amplifier system comprising:
   a low-noise amplifier having an input node and an output node in a receive path; and
   a first capacitance equalization network coupled to the output node, wherein the first capacitance equalization network comprises a varactor and a bias voltage source coupled to the varactor such that the varactor is configured to generate a compensation capacitance as a function of output signal voltage at the output node such that the compensation capacitance sums with a non-linear capacitance of the low-noise amplifier to provide a total capacitance at the output node that varies by no more than ±5% over an output voltage range within voltage headroom limits of the low-noise amplifier for a given supply voltage of the low-noise amplifier.

2. The low-noise amplifier system of claim 1 wherein the total capacitance at the output node varies by no more than ±1% over the output voltage range within the voltage headroom limits of the low-noise amplifier for the given supply voltage.

3. The low-noise amplifier system of claim 1 wherein the total capacitance at the output node varies by no more than ±0.2% over the output voltage range within the voltage headroom limits of the low-noise amplifier for the given supply voltage.

4. The low-noise amplifier system of claim 1 wherein the given supply voltage is in a range from 0.5 V to 1.8 V.

5. The low-noise amplifier system of claim 1 wherein the first capacitance equalization network comprises an inversion mode varactor having an inversion mode capacitance that makes up at least a portion of the compensation capacitance.

6. The low-noise amplifier system of claim 1 wherein the first capacitance equalization network comprises an accumulation mode varactor having an accumulation mode capacitance that makes up at least a portion of the compensation capacitance.

7. The low-noise amplifier system of claim 1 wherein the first capacitance equalization network comprises a positive-negative (PN) junction-type varactor having a PN capacitance that makes up at least a portion of the compensation capacitance.

8. The low-noise amplifier system of claim 1 wherein the first capacitance equalization network comprises a positive-intrinsic-negative (PIN) junction-type varactor having a PIN capacitance that makes up at least a portion of the compensation capacitance.

9. The low-noise amplifier system of claim 1 wherein the bias voltage source is configured to provide a variable bias voltage that is adjustable in response to any of process changes, supply voltage changes, and temperature changes.

10. The low-noise amplifier system of claim 1 further including a programmable capacitor array configured to adjust a nominal compensation capacitance in response to a control signal, wherein the programmable capacitor array is coupled in parallel with the first capacitance equalization network.

11. The low-noise amplifier system of claim 10 wherein the programmable capacitor array comprises a plurality of fixed-value capacitors selectably coupled between the output node and a fixed voltage node through a plurality of electronic switches that individually open and close in response to the control signal.

12. The low-noise amplifier system of claim 11 further including a controller configured to provide the control signal that opens and closes individual ones of the plurality of electronic switches.

13. The low-noise amplifier system of claim 1 wherein a varactor of the first capacitance equalization network is coupled in parallel with a cascode field-effect transistor (FET) of the low-noise amplifier.

14. The low-noise amplifier of claim 13 further including a second capacitance equalization network coupled to the output node.

15. The low-noise amplifier system of claim 1 further including a second capacitance equalization network coupled to the output node and configured to contribute capacitance to the compensation capacitance in a piecewise-linear fashion.

16. The low-noise amplifier system of claim 15 wherein the low-noise amplifier comprises series-coupled p-type FETs (PFETs) coupled in series at the output node with series-coupled n-type FETs (NFETs), wherein a first varactor of the first capacitance equalization network is formed in an N-well with the NFETs and a second varactor of the second capacitance equalization network is formed in a P-well with the PFETs.

17. The low-noise amplifier system of claim 1 further including an input capacitance equalization network coupled to the input node, wherein the input capacitance equalization network is configured to provide an input compensation capacitance as a function of input signal magnitude applied to the input node.

18. The low-noise amplifier system of claim 17, wherein the input capacitance equalization network includes an input varactor coupled between the input node and a fixed voltage node.

* * * * *